United States Patent [19]

Oji

[11] Patent Number: 5,420,449

[45] Date of Patent: May 30, 1995

[54] CAPACITOR FOR A SEMICONDUCTOR DEVICE

[75] Inventor: Hiroshi Oji, Kyoto, Japan

[73] Assignee: Rohm Co., Ltd., Kyoto, Japan

[21] Appl. No.: 227,173

[22] Filed: Apr. 13, 1994

Related U.S. Application Data

[63] Continuation of Ser. No. 29,633, Mar. 11, 1993, abandoned.

[30] Foreign Application Priority Data

Apr. 17, 1992 [JP] Japan .................................. 4-097845

[51] Int. Cl.$^6$ ..................... H01L 27/02; H01L 29/68; H01L 29/78
[52] U.S. Cl. .................................. 257/307; 257/311; 257/316; 257/344; 257/408; 257/532; 257/535; 257/640
[58] Field of Search ................ 257/532, 535, 640, 316, 257/306, 307, 311, 344, 408; 361/303, 305, 306, 308, 310

[56] References Cited

U.S. PATENT DOCUMENTS

| | | | |
|---|---|---|---|
| 4,441,249 | 4/1984 | Alspector et al. | 257/532 |
| 4,603,059 | 7/1986 | Kiyosumi et al. | 257/640 |
| 5,126,808 | 6/1992 | Montalvo et al. | 257/316 |

FOREIGN PATENT DOCUMENTS

| | | | |
|---|---|---|---|
| 58-23470 | 2/1983 | Japan | 257/532 |
| 59-55049 | 3/1984 | Japan | 257/532 |
| 59-104156 | 6/1984 | Japan | 257/306 |
| 60-74470 | 4/1985 | Japan | 257/307 |
| 61-141166 | 6/1986 | Japan | 257/532 |
| 63-239970 | 10/1988 | Japan | 257/532 |
| 1-120858 | 5/1989 | Japan | 257/307 |
| 2-135772 | 5/1990 | Japan | 257/532 |
| 2-302074 | 12/1990 | Japan | 257/532 |
| 4-56264 | 2/1992 | Japan | 257/307 |

*Primary Examiner*—Ngan V. Ngo
*Attorney, Agent, or Firm*—Nikaido, Marmelstein, Murray & Oram

[57] ABSTRACT

A semiconductor device having a capacitor of a large capacitance in spite of its small area, is composed of a first insulating film formed on a semiconductor substrate, a first polysilicon film, a second insulating film and a second polysilicon film which are formed in that order on the first insulating film. The second polysilicon film is connected to the semiconductor substrate by means of a metal film to function as one electrode while the first polysilicon film functions as the other electrode. The first and second insulating film are each made of a dielectric material.

4 Claims, 2 Drawing Sheets

CAPACITOR FOR A SEMICONDUCTOR DEVICE

This application is a continuation of application Ser. No. 08/029,633 filed Mar. 11, 1993, now abandoned.

FIELD OF THE INVENTION

The present invention relates to a semiconductor device and a method for producing the same, and more particularly, to a semiconductor device provided with a capacitor having a large capacitance and a small area, and a method for producing the same.

BACKGROUND OF THE INVENTION

FIG. 4 shows a capacitor structure in a conventional semiconductor device, wherein numeral 30 denotes a semiconductor substrate, numeral 31 denotes an insulating film, for example, made of film oxide, and numeral 32 denotes an electrode film formed of a polysilicon film, the electrode film 32 functioning as one electrode of the capacitor while the semiconductor substrate 30 as the other electrode thereof.

However, in order to obtain a capacitor having a large capacitance with a small capacitor area in a structure shown in FIG. 4, the insulating film 31 needs to be formed of a material having a relatively high dielectric constant and to be made thin. As an insulating film which is easily formed on a semiconductor substrate, the film made of silicon oxide, silicon nitride or the like is employed. However, the dielectric constant of such a film is not very high, for example, 4 to 8. Moreover, such an insulating film is usually relatively thick, or several hundred Å, and the capacitance of a capacitor having such film is relatively small, for example, about 5 FF/$\mu m^2$. Accordingly, a larger capacitor area is needed for obtaining a larger capacitance, and thus the capacitor occupies a larger area in a chip. This arises a problem of going against the demand for higher integration and the recent inclination of small-sized devices.

SUMMARY OF THE INVENTION

In view of the above-mentioned circumstances, an object of the present invention is to provide a semiconductor device wherein the drawback of the prior art is resolved. Specifically, the object of the present invention is to provide a semiconductor device provided with a capacitor having a large capacitance but occupying a small area, and a method for producing the same.

According to the present invention, there is provided a semiconductor device having a capacitor comprising a first insulating film formed on a semiconductor substrate, a first polysilicon film, a second insulating film and a second polysilicon film which are formed in that order on the first insulating film, wherein the second polysilicon film is connected to the semiconductor substrate by means of a metal film to function as one electrode while the first polysilicon film functions as the other electrode; and the first and second insulating film are each made of a dielectric material.

It is preferable that the above device includes a flash memory having a floating gate.

It is preferable that the second insulating film comprises a silicon oxide film, a silicon nitride film and a silicon oxide film so as to have a three-layered structure.

It is preferable that the second insulating film comprises a silicon oxide film, a silicon nitride film and a silicon oxide film so as to have a three-layered structure.

According to the present invention, there is also provided a method for producing a semiconductor device having a capacitor part comprising steps of: (a) forming a first insulating film on a semiconductor substrate; (b) forming a first polysilicon film on the first insulating film; (c) forming a second insulating film on the first polysilicon film; (d) forming a second polysilicon film on the second insulating film; (e) forming a protective film on the second polysilicon film; and (f) forming first, second and third contact holes in the protective film which extend downward to the first polysilicon film, the second polysilicon film and the semiconductor substrate, respectively, and forming a first electrode film connected to the first polysilicon film through the first contact hole and a second electrode film connecting the second polysilicon film to the semiconductor substrate through the second and third contact holes, whereby the capacitor part is formed.

According to the present invention, there is further provided method for producing a semiconductor device having a capacitor part and a flash memory cell part comprising steps of:
(a) forming both a first insulating film in the capacitor part and a gate insulating film in the flash memory cell part simultaneously;
(b) forming both a first polysilicon film in the capacitor part and a floating gate in the flash memory cell part simultaneously;
(c) forming both a second insulating film in the capacitor part and an interlayer insulating film in the flash memory cell part simultaneously; and
(d) forming both a second polysilicon film in the capacitor part and a control gate electrode in the flash memory cell part simultaneously.

DETAILED DESCRIPTION

Now, the present invention will be described in detail with reference to the drawings.

Figure 1:
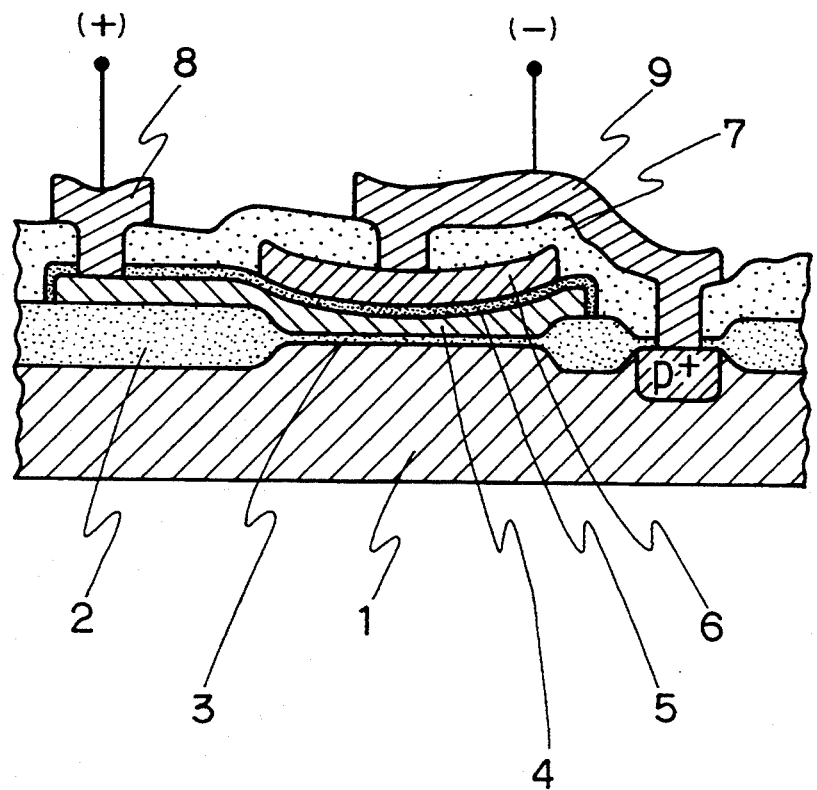
FIG. 1 is a sectional view showing a capacitor part of a semiconductor device according to an embodiment of the present invention.

Referring to FIG. 1, numeral 1 denotes a semiconductor substrate, for example, made of silicon, numeral 2 denotes a field oxide film, for example, made of silicon oxide which is formed on the semiconductor substrate 1, numeral 3 denotes a first insulating film made of the same material as that of the field oxide film 2 or silicon nitride, numeral 4 denotes a first polysilicon film formed on the first insulating film 3, one end of the first polysilicon film being adapted to connect to an electrode 8. On the first polysilicon film 4, a second insulating film 5, or an interlayer insulator is formed. The second insulating film 5 can be formed of a three-layered structure comprising a silicon oxide film, silicon nitride film and silicon oxide film or of any one of these films. It is preferable to employ the second insulating film 5 having the three-layered structure, because it would impart the resulting device with an excellent leakage-currentinhibiting characteristic so that the thickness of the second insulating film 5 itself could be made small. On the second insulating film 5, a second polysilicon 6 is formed, and a protective film 7, for example, made of silicon oxide, silicon nitride or the like is formed on the second polysilicon 6.

After formation of contact holes in the protective film 7, a metal film, for example, made of aluminum or the like is deposited by sputtering, then patterned to form a first electrode film 8 which is connected to the first polysilicon film 4, and a second electrode film 9 which is connected at one end thereof to the second polysilicon 6. The other end of the second electrode film 9 is connected to the semiconductor substrate 1 via the contact hole extending through the protective film under which the polysilicon films 4 and 6 are absent and the first insulating film 3.

In the semiconductor device of the present invention, the first insulating film 3 interposed between the semiconductor substrate 1 and the first polysilicon film 4 and the second insulating film 5 interposed between the first and second polysilicon films 4 and 6 are each composed of a material which enables to constitute a part of a capacitor. Further, the first polysilicon film 4 is adapted to function as one electrode by providing a contact with the first electrode film 8, while the second polysilicon film is short-circuited with the semiconductor substrate 1 through the second electrode film 9 and adapted to function as the other electrode, whereby the two insulating films storing electric charge form a parallel circuit.

Figure 2:
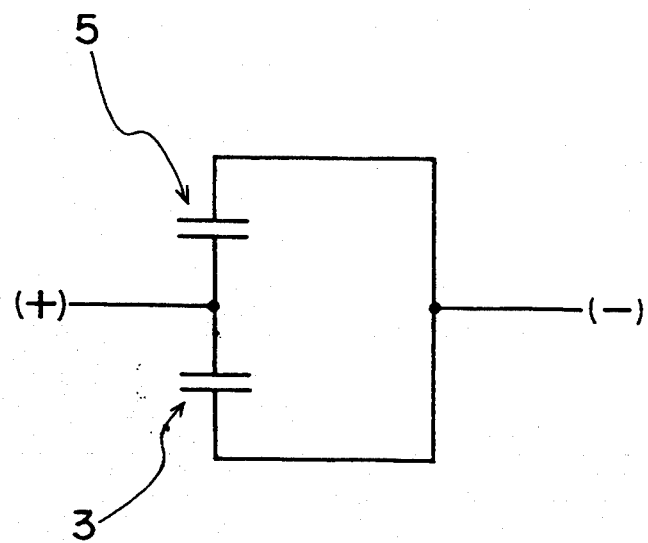
FIG. 2 is a diagram showing an equivalent circuit of the capacitor in the embodiment of FIG. 1.

FIG. 2 is a diagram showing an equivalent circuit of the capacitor structure in FIG. 1. As can be clearly understood from FIG. 2, the sum of the capacitances of the first and second insulating films 3 and 5 assumes the capacitance of the whole capacitor; thus, a capacitor having a large capacitance can be obtained while occupying a small area.

Figure 3:
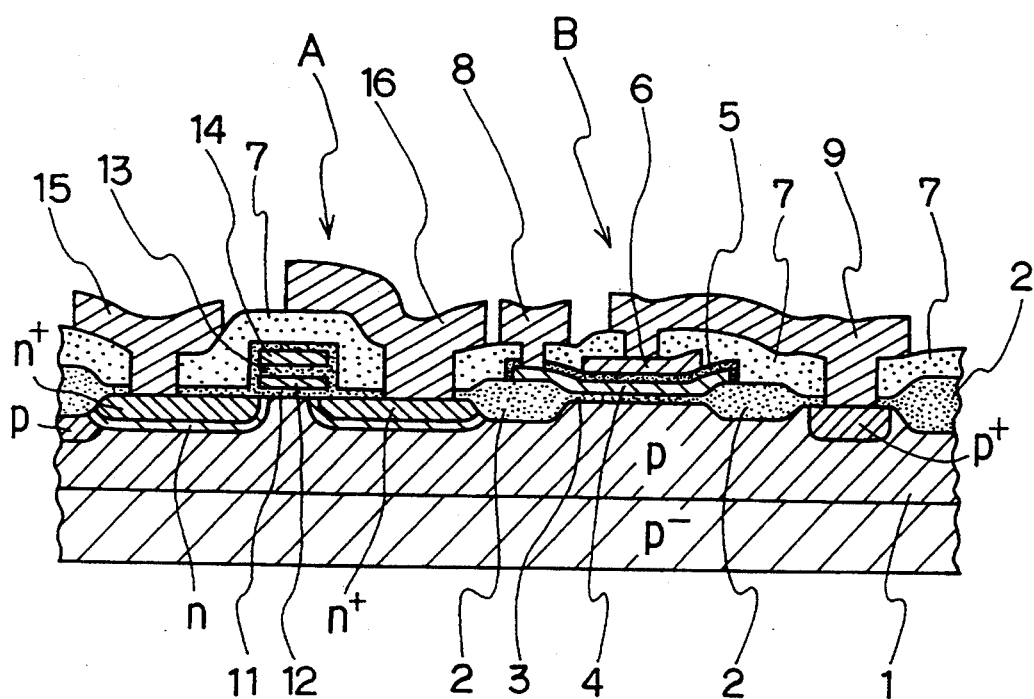
FIG. 3 is a sectional view showing a semiconductor device having a flash memory part and a capacitor part according to an embodiment of the present invention.
Figure 4:
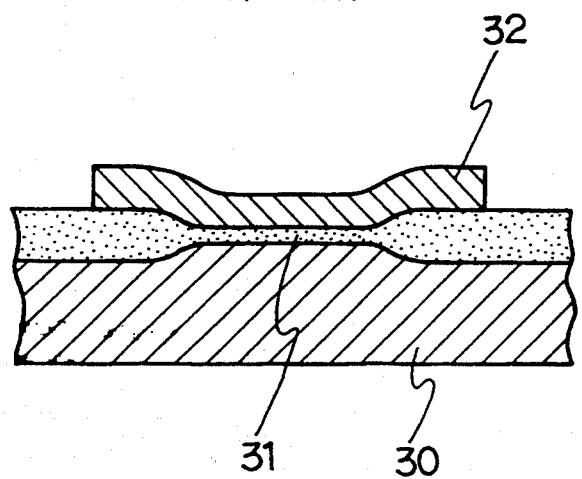
FIG. 4 is a sectional view showing a conventional capacitor.

The structure of the semiconductor device according to the present invention, wherein the first polysilicon film 4, second insulating film 5 and second polysilicon 6 are formed in that order on the first insulating film 3 covering the semiconductor substrate 1, is similar to that of a flash memory having a floating gate. Accordingly, application of the capacitor structure of the present invention to a capacitor of a semiconductor device having a flash memory makes it possible to readily form a capacitor by the same process as that for the flash memory, so that the application is particularly effective. FIG. 3 is a sectional view showing a semiconductor device having a flash memory part and a capacitor part which are arranged side by side, for illustrating the case where a flash memory and a capacitor are provided in one chip.

Referring to FIG. 3, a portion B on the right hand side is a capacitor part having the same structure as in FIG. 1, while a portion A on the left hand side is a flash memory part. The flash memory part A has a structure wherein a floating gate electrode 12, interlayer insulating film 13, control gate electrode 14 and protective film 7 are stacked up in that order on a gate insulating film 11. The insulating films and gate electrodes can be formed of the same materials as used for the insulating films and polysilicon films in the capacitor shown in FIG. 1, respectively. Accordingly, by virtue of changing device layouts a semiconductor device having both a large-capacitance capacitor and a flash memory can be obtained without changing or increasing the production process.

Next, a method for producing a semiconductor device as shown in FIG. 3 is described comparing the arrangement of the capacitor part with that of the flash memory part.

Firstly, a field oxide film 2 is formed on a semiconductor substrate 1 for device isolation. Practically, the semiconductor substrate 1 masked with a silicon nitride film or the like was subjected to a thermal oxidation at about 1100° C. for 90 minutes to form a silicon oxide film.

Secondly, a thin insulating film is formed to cover a region for forming a capacitor and a region for forming a flash memory. The thin insulating film in the capacitor part B is a first insulating film 3, while that in the flash memory part A is a gate oxide film 11. Practically, the semiconductor substrate 1 interposed between the field oxide films 2 was exposed and subjected to a thermal oxidation at about 850° C. for about 30 minutes to form a silicon oxide film of 100 to 150 Å thick.

Next, a polysilicon film is formed as a first polysilicon film 4 defining one electrode in the capacitor part B and as a floating gate electrode 12 in the flash memory part A. Practically, the polysilicon film was formed to 2000 to 2500 Å thick by a heat treatment under silane gas atmosphere at 600° to 650° C. for about 30 minutes, then patterned to form the respective electrodes. In this case, the first polysilicon film 4 in the capacitor part B was extended to partially cover the field oxide film 2 so that a formation region for a first electrode film can be formed.

Next, an insulating film is formed again. This insulating film is used for a second insulating film 5 in the capacitor part B while the insulating film is used for an interlayer insulating film 13 interposed between the floating gate electrode 12 and a control gate electrode 14 to be formed later in the flash memory part A. The insulating film including the insulating film 5 and 13 is preferably made thin, and usually has a film-oxide-equivalent thickness of 200 to 300 Å. In the present specification, the term "film-oxide-equivalent thickness" means such thickness obtained by converting a film thickness into that of film-oxide. The insulating film can be formed of silicon oxide, silicon nitride, tantalum pentoxide or the like using CVD, PVD, thermal oxidation or a like method. Practically, a three-layered insulating film comprising a silicon oxide film, silicon nitride film and silicon oxide film was formed to have a film-oxide-equivalent thickness of 200 to 300 Å by CVD. The reason why the three-layered structure was adopted is that there is a need to minimize a leakage current, which greatly affects a flash memory and that the insulating film in the capacitor part needs to be made thin. However, the insulating film can be formed of one layer of any of the above three films.

Furthermore, a polysilicon film is formed again which defines a second polysilicon film 6 in the capacitor part B while defining a control gate electrode 14 in the flash memory part A. Practically, in the same manner as for the first polysilicon film, a polysilicon film was formed to 3500 to 4500 Å thick, then patterned to have a second polysilicon film 6 in the capacitor part B and a control gate electrode 14 in the flash memory part A.

Finally, a protective film 7 is formed to cover the whole surface of the resulting structure, contact holes are formed, and then, an electrode film are formed. The protective film 7 can be formed of a silicon oxide film, film nitride or the like using CVD, PVD or the like, while the electrode film is formed of aluminum, tungsten silicide (W—Si) or the like using sputtering. The electrode film thus formed is patterned to form a first electrode film 8 and a second electrode film 9 in the capacitor part B and to form electrodes 15 and 16 for the source and drain in the flash memory part A. In forming the electrode film, the second electrode film 9 is so formed as to connect the second polysilicon film 6 to the semiconductor substrate 1. Practically, a silicon oxide film was formed to about 0.6 $\mu$m thick as the protective film 7 by CVD. The silicon oxide film which is formed in regions for forming a contact hole was selectively etched using a resist mask to form the contact holes. An aluminum film was then deposited by sputtering and patterned to form the electrode films for the respective contact holes.

As described above, if the capacitor structure according to the present invention is applied in a semiconductor device having a flash memory, a capacitor of a large capacitance can be formed in a small area by the same process as for forming a flash memory.

In the semiconductor device of the present invention, the first and second insulating films are so arranged as to form a parallel circuit; hence, a capacitor of a large capacitance can be obtained in a small area. Accordingly, a semiconductor device requiring a large capacitance can be formed on a small chip.

Furthermore, in forming a semiconductor device having a flash memory, a capacitor of a large capacitance can be provided in that device by the same process as for forming the flash memory; thus, a high-performance semiconductor device can be produced on a small chip without increasing the production cost.

Though several embodiments of the present invention are described above, it is to be understood that the present invention is not limited only to the above-mentioned and various changes and modifications may be made in the invention without departing from the spirit and scope thereof.

What is claimed is:

1. A semiconductor device having a capacitor comprising:

a semiconductor substrate;

a first insulating film formed on said semiconductor substrate in an area of said semiconductor substrate which is interposed between field oxide films, said area being free of a pn junction;

a first polysilicon film formed on said first insulating film;

a second insulating film formed on said first polysilicon film; and a second polysilicon film which is formed on the second insulating film, wherein the second polysilicon film is connected to the semiconductor substrate in a region which is free of said first and second polysilicon films by means of a metal film to function as one electrode of the capacitor while the first polysilicon film functions as another electrode of the capacitor, and wherein the first and second insulating films are each made of a dielectric material.

2. A semiconductor device of claim 1, further including a flash memory having a floating gate.

3. A semiconductor device of claim 1, wherein the second insulating film comprises a silicon oxide film, a silicon nitride film and a silicon oxide film so as to have a three-layered structure.

4. A semiconductor device of claim 2, wherein the second insulating film comprises a silicon oxide film, a silicon nitride film and a silicon oxide film so as to have a three-layered structure.

* * * * *